United States Patent [19]

Bozarth et al.

[11] Patent Number: 4,567,466

[45] Date of Patent: Jan. 28, 1986

[54] SENSOR COMMUNICATION SYSTEM

[75] Inventors: Theodore B. Bozarth, Perkasie; Anthony M. Demark, Plymouth Meeting; Edward F. Finn, Warminster; Frank Lynch, Hatboro, all of Pa.

[73] Assignee: Honeywell Inc., Minneapolis, Minn.

[21] Appl. No.: 447,818

[22] Filed: Dec. 8, 1982

[51] Int. Cl.⁴ .............................................. H03M 1/10
[52] U.S. Cl. ............................ 340/347 AD; 324/115; 340/347 CC
[58] Field of Search ................. 340/347 CC, 347 NT, 340/347 AD; 324/115, 116, 99 D; 364/427, 557, 571

[56] References Cited

U.S. PATENT DOCUMENTS

| | | | |
|---|---|---|---|
| 3,108,183 | 10/1963 | Ganley | 364/424 |
| 4,122,719 | 10/1978 | Carlson | 364/557 |
| 4,198,676 | 5/1980 | Varnum | 374/170 |
| 4,264,961 | 5/1981 | Nishimura | 364/571 |
| 4,307,453 | 12/1981 | Kleiss | 364/571 |
| 4,338,665 | 7/1982 | Aono | 364/571 |
| 4,360,888 | 11/1982 | Onksen | 364/440 |
| 4,473,797 | 9/1984 | Shiota | 364/571 |
| 4,480,312 | 10/1984 | Wingate | 364/557 |

OTHER PUBLICATIONS

Millman, "Microelectronics", McGraw-Hill Book Co., 1979, pp. 627, 628, 646.

Primary Examiner—Errol A. Krass
Attorney, Agent, or Firm—Mitchell J. Halista; Trevor B. Joike

[57] ABSTRACT

A sensor communication system uses a shared analog signal to duty cycle converter for producing a comparison between a predetermined free-running triangular waveshape and a selected output signal from a plurality of analog signal sources such as process sensors, to convert the amplitude of the analog signal to a variable duty cycle signal. The variable duty cycle signal is subsequently converted to a digital signal which may be represented by a count stored in a counter counting clock pulses during the occurrence of the pulse width waveshape of the variable duty cycle signal. The digital signal is utilized as a digital word by a microprocessor operating in accordance with a stored program to produce a characterized digital output signal for use in a communication after conversion to a 4–20 ma control signal for communication and control in an industrial process control system. One of the signal sources may be from a circuit having temperature and time drift components whereby the corresponding digital word is used by the microprocessor to compensate the digital words from the other analog signal sources.

4 Claims, 4 Drawing Figures 4,567,466

SENSOR COMMUNICATION SYSTEM

BACKGROUND OF THE INVENTION

Field of the Invention

The present invention relates to sensor communication systems. More specifically, the present invention is directed to a sensor communication system utilizing an analog signal amplitude to pulse width converter.

SUMMARY OF THE INVENTION

An object of the present invention is to provide an improved sensor communication system having an analog signal amplitude to pulse width converter.

In accomplishing this and other objects, there has been provided, in accordance with the present invention, a sensor communication system having an input multiplexer for selecting one of a plurality of analog input signals one of the analog input signals being a compensation signal obtained from a temperature responsive circuit, a variable gain amplifier for amplifying a signal selected by the multiplexer, a free-running triangle wave generator, a comparator means connected to the amplifier and the generator for comparing an output signal from the amplifier and the generator to produce a variable duty cycle signal representative of the output signal from the amplifier, converter means for converting the variable duty cycle signal to a digital word, an input selector for controlling the multiplexer, a range selector for selecting a gain level of the amplifier and a digital signal handling means for receiving and for concurrently controlling the input selector and the gain selector whereby the input selector is controlled by the signal handling means to select the compensation signal for each gain level selected by the range selector.

BRIEF DESCRIPTION OF THE DRAWINGS

A better understanding of the present invention may be had when the following detailed description is read in connection with the accompanying drawings, in which.

DESCRIPTION OF THE PREFERRED EMBODIMENT

Detailed Description

Figure 1:
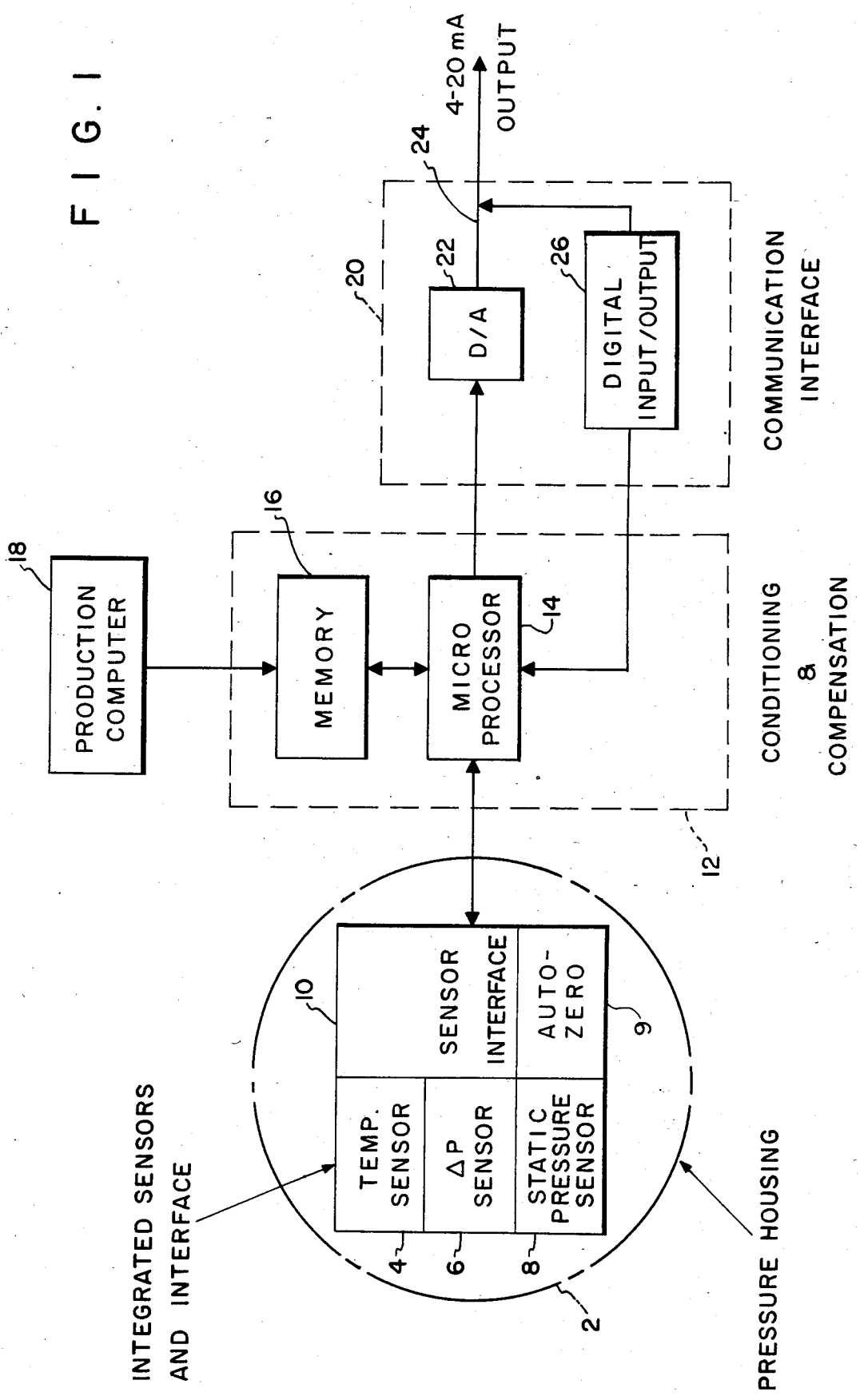
FIG. 1 is a block diagram of an analog signal conversion system embodying an example of the present invention.

Referring to FIG. 1 in more detail, there is shown a process variable sensor system incorporating an example of the present invention for modulating the output of process variable responsive sensors which may be contained in a pressure housing 2. The sensors may, for example, be a temperature sensor 4, a differential pressure sensor 6 and a static pressure sensor 8. The sensors 4, 6 and 8 and an auto-zero circuit 9 are connected through a shared sensor interface 10 to a signal conditioning and compensation system 12. The system 12 may include a microprocessor 14 having a memory 16 and may be physically attached to the pressure housing 2 whereby the microprocessor 14 and memory 16 are dedicated units servicing the sensors 4, 6, 8 and sensor interface 10. A production computer 18 is used during the manufacture of the sensor system and supplies characterizing data to be stored in the memory 16 associated with the sensor interface 10, and the sensors in the pressure housing 2. A digital output from the microprocessor 14 is applied to a communication interface 20. The communication interface 20 may include a digital-to-analog converter 22 arranged to convert the digital output signals from the microprocessor 14 to 4–20 ma analog signals for application on analog signal output line 24 for subsequent control and communication with an industrial process (not shown). A digital input/output communication device 26 is also located in the interface 20 for providing digital communication between devices (not shown) connected to the output line 24.

Figure 2:
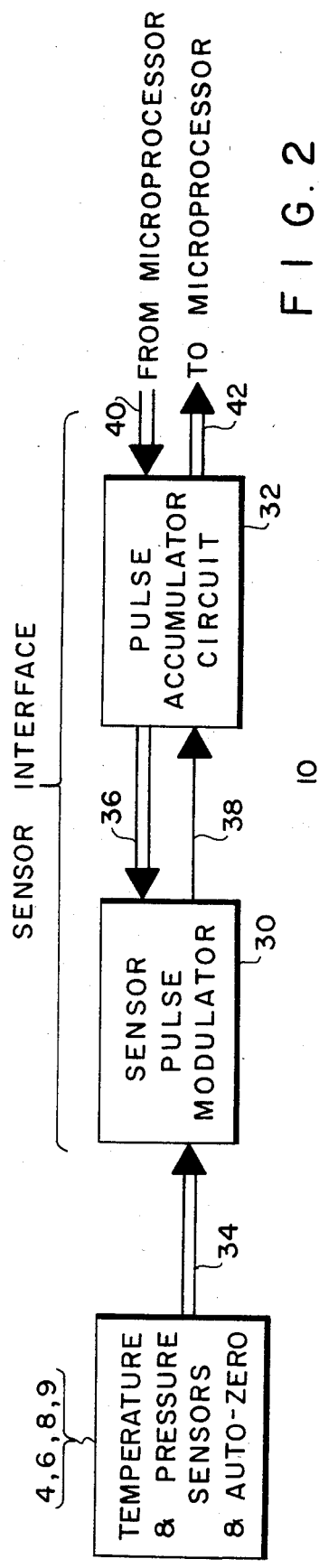
FIG. 2 is a block diagram of a portion of the system shown in FIG. 1.

As shown by a block diagram in FIG. 2, the shared sensor interface 10 includes a sensor pulse modulator 30 and a pulse accumulator circuit 32. The sensor pulse modulator 30 is arranged to receive inputs from the temperature and pressure sensors 4, 6, 8 over an input line 34. Concurrently, the sensor pulse modulator 30 is connected to the pulse accumulator circuit 32 by a modulator control line 36 and a modulator output line 38. The pulse accumulator circuit 32, in turn, is connected to the microprocessor 14 by an input line 40 and an output line 42.

Figure 3:
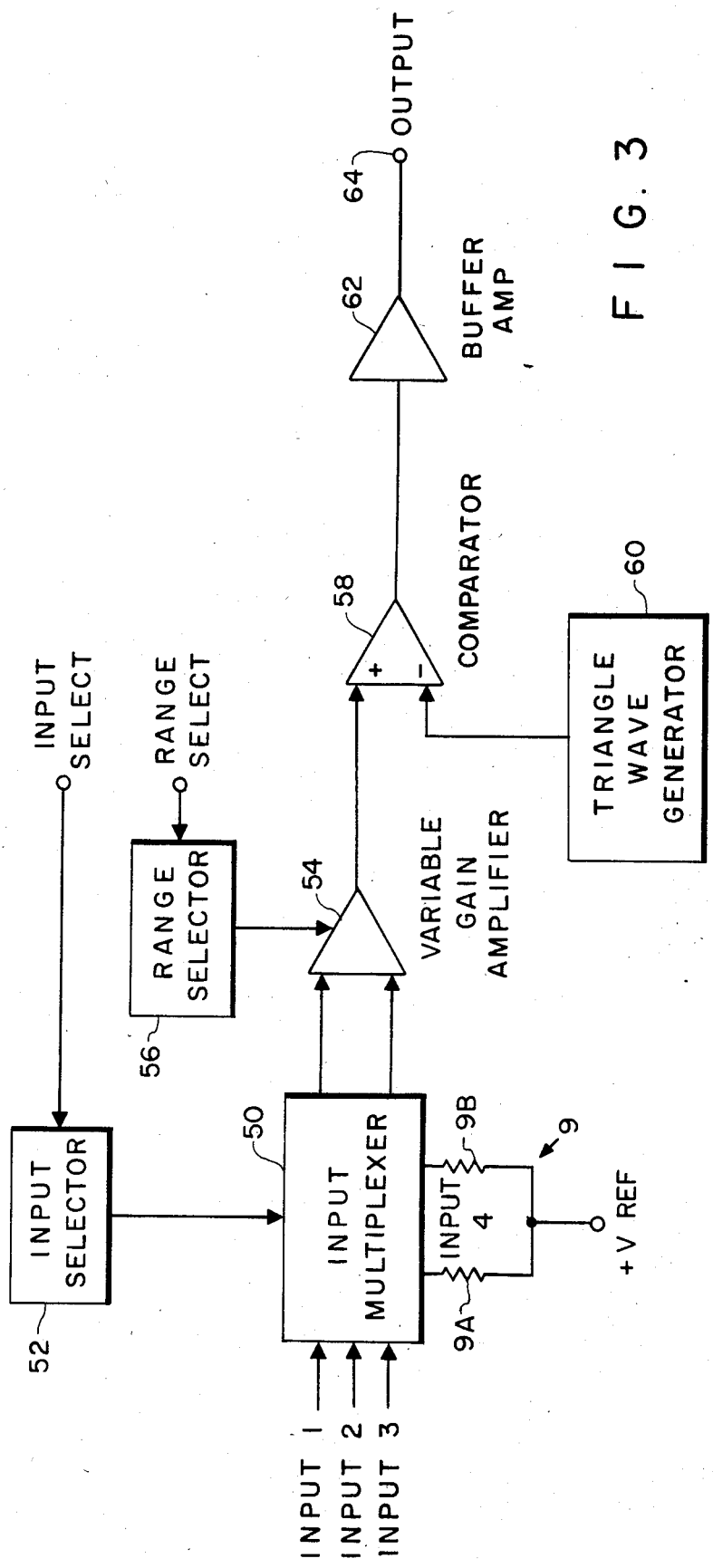
FIG. 3 is a block diagram of a sensor pulse modulator suitable for use in the system shown in FIGS. 1 and 2.

In FIG. 3, there is shown a block diagram for the shared sensor pulse modulator 30 for producing a variable duty cycle output signal having a pulse width representation of a selected one of each of a plurality of analog input signals supplied on respective ones of a plurality of input lines. The sensor input lines, input 1, input 2, input 3 and the auto-zero input 4, are connected to an input multiplexer 50 to be selected by control signals from an input selector 52 controlled, in turn, by an input select signal from the microprocessor 14. The auto-zero input is obtained from the auto-zero circuit 9 including a pair of resistors 9A, 9B energized by the $+V_{ref}$ source. The output of the multiplexer 50 is applied to a variable gain amplifier 54 having its gain controlled by control signals from a range selector 56 connected to a range select input signal from the microprocessor 14. The input select signal and the range select signal are applied to the modulator 30 over the modulator control line 36 shown in FIG. 2.

The output of the variable gain amplifier 54 is connected as one input to a comparator 58. A second input to the comparator 58 is obtained from a free-running triangle wave generator 60. An output signal from the comparator 58 is applied through a buffer amplifier 62 providing a low impedance output and voltage level translation to an output terminal 64 which is connected to the pulse accumulator circuit 32 shown in FIG. 2.

Figure 4:
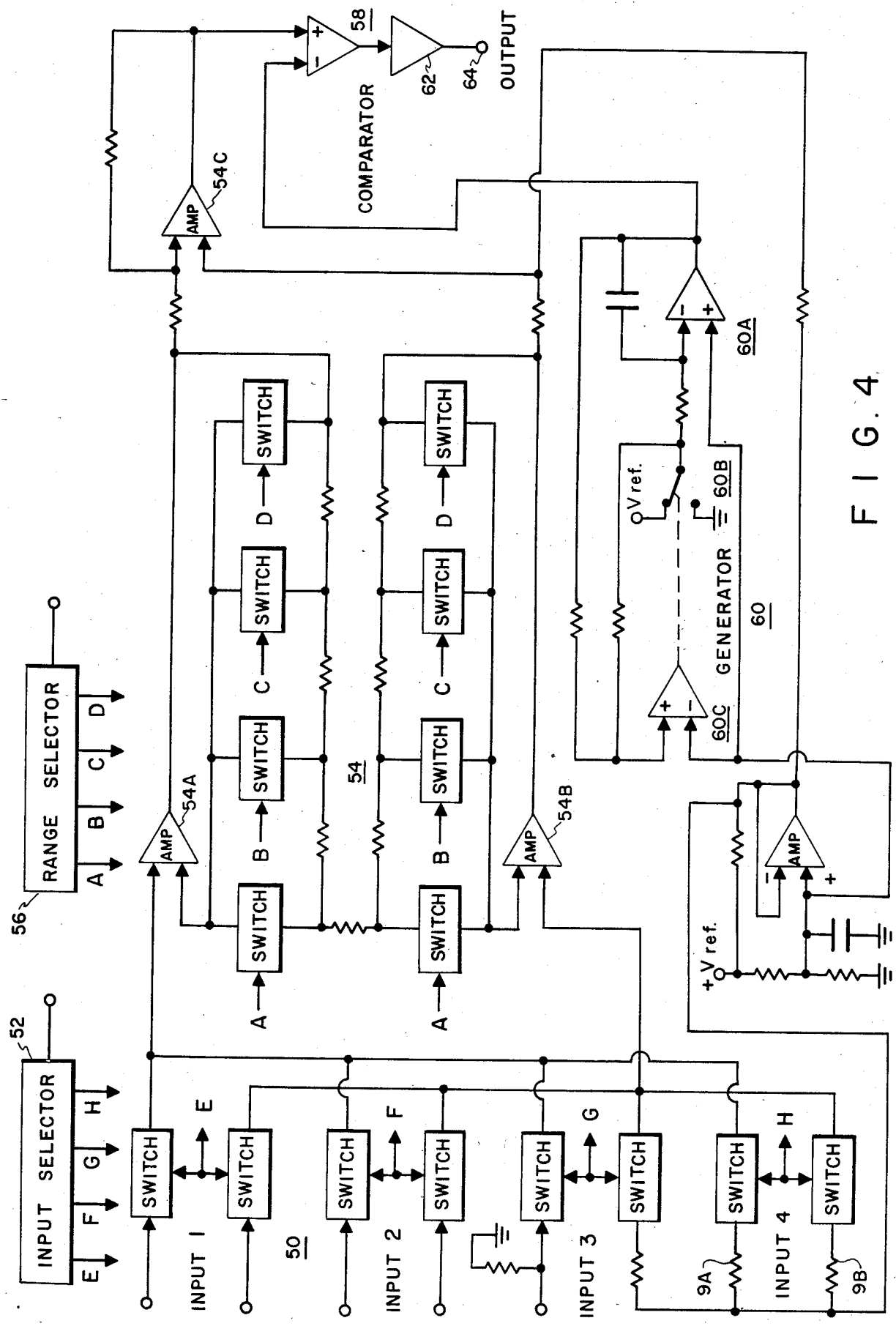
FIG. 4 is a schematic illustration of the sensor pulse modulator shown in FIG. 3.

In FIG. 4, there is shown a schematic illustration of an example of the sensor modulator circuit shown in FIG. 3 including the multiplexer 50, the variable gain amplifier 54, the comparator 58, the triangle wave generator 60 and the buffer amplifier 62. Specifically, the multiplexer 50 is controlled by the output control signals from the input selector 52 which are effective to control corresponding multiplexer switches for selectively connecting the inputs to the multiplexer 50 to an output of the multiplexer 50 which, in turn, is connected to the input of the variable gain instrumentation amplifier 54. Thus, the output signals E, F, G and H from the input selector 52 control the switches in the multiplexer 50. Concurrently, the output signals A, B, C, and D from the range selector 56 control switches arranged to effect the insertion of feedback resistors in the feedback circuits of a pair of dual amplifiers 54A, 54B used in the variable gain amplifier 54.

The outputs of the dual amplifiers 54A, 54B, are applied to separate inputs of a differential amplifier 54C which is used for amplification and level shifting of the input signals to produce an output signal on a single ended amplifier output for application to the comparator 58. A second input to the comparator 58 is obtained from a free running triangular waveform generator 60. Briefly, the waveform generator 60 includes a voltage reference $V_{ref}$, an integrator 60A, a switch 60B and a hysteresis comparator 60C. The operational integrator 60A provides an input to the comparator 60C and when the integrator output reaches a so-called "trip point" of an input voltage hysteresis band, the output of the comparator changes state which, in turn, actuates the switch 60B between $V_{ref}$ and common to cause the output ramp signal to change direction to produce a triangular waveshape output signal from the generator 60. The comparator 58 compares the voltage waveform output of the triangular waveform generator 60 with the selected sensor voltage applied through the multiplexer 50 and the variable gain amplifier 54. The output from the comparator 58 is in a low level state during the time that the amplified and level shifted voltage is less than the output signal from the triangular waveform generator 60. Since this sensor or auto-zero voltage value changes with varying outputs from the sensors or auto-zero circuit, the duty cycle or pulse width of the output from the comparator 58 correspondingly changes.

The analog-to-digital conversion function is completed by the pulse accumulator circuit 32 shown in FIG. 2 to convert the information contained in the duty cycle output of the sensor pulse modulator 30 into a digital word which is usable by the microprocessor 14. The pulse accumulator circuit 32 may contain counters (not shown) for accumulating clock pulses during the "on" time of the duty cycle output signal from the sensor pulse modulator 30 whereby the count stored in the counter is subsequently read by the microprocessor 14 as a representation of the pulse width or duty cycle output of the sensor pulse modulator 30. For example, during the duty cycle output time of the output signal from the sensor pulse modulator 30, a first set of counters in the pulse accumulators circuit 32 accumulates clock pulses during the "on" time of the duty cycle waveform while a second set of counters counts clock pulses during the entire period of the output signal.

In summary, the sensor to pulse modulator 30 is the shared interface between the sensors 4, 6, 8 and the auto-zero circuit 9 and the digital electronics in the conditioning and compensation circuit 12. A sensor to pulse modulator 30 converts each of the sensor and auto-zero output voltages into a varying duty cycle output signal and by proper selection of the selector 52 and the range selector 56, one of the available input signals and amplifier gains are selected. The output of the sensor pulse modulator 30 is a free-running, pulse width modulated square wave with a frequency of operation being determined by the frequency of the triangular wave generator 60. The analog signal output from the modulator 30 is converted into a digital representation, e.g., a stored count, by the pulse accumulator circuit 32 operating as an analog-in-digital converter.

The counts from the accumulator 32 are transferred to the microprocessor 14 for use as digital representations of the duty cycle output from the sensor pulse modulator 30, i.e., sensor and auto-zero output signals. The microprocessor 14 stores the counts as digital words in the memory 16 and performs data handling operations thereon in accordance with a stored program.

An auto-zero measurement is made in all gain ranges selected by the range selector 56 on a successive or periodic basis by a selection of input 4 to the multiplexer 50. The value of the auto-zero signal obtained from the auto-zero resistors 9A, 9B is used, after an analog-to-digital conversion, by the microprocessor 14 to correct for zero error in the electronic circuitry caused by the temperature and/or time drift. Finally, the digital output from the microprocessor 14 is applied to a digital-to-analog converter 22 in the communication interface 20 to produce a corresponding analog current signal for application to a 4–20 ma communication line 24. This 4–20 ma signal can be utilized for process control in any conventional manner, such process control operations being well-known in the art.

Accordingly, it may be seen that there has been provided, in accordance with the present invention, an improved sensor communication system having an analog signal to pulse width converter.

The embodiments of the invention in which an exclusive property or privilege is claimed are defined as follows:

1. An analog signal communication system comprising
   an input multiplexer for selecting one of a plurality of analog input signals, one of said analog input signals being a compensation signal obtained from a temperature responsive circuit,
   a variable gain amplifier means for amplifying an output signal from said input multiplexer,
   a free running triangle wave generator,
   a comparator means connected to said amplifier and said generator for comparing an output signal from said variable gain amplifier and said generator to produce a variable duty cycle output signal representative of the amplitude of the output signal from said variable gain amplifier,
   means for converting said variable duty cycle output signal to a digital word,
   an input selector for controlling said input multiplexer to select said analog input signals,
   a range selector for selecting a gain level of said variable gain amplifier, and
   a digital signal handling means connected to said means for converting to receive said digital word and for concurrently controlling said input selector and said range selector whereby said input selector is controlled by said signal handling means to select said compensation signal for each gain level selected by said range selector wherein said variable gain amplifier means includes a pair of amplifiers arranged to receive an output signal from said input multiplexer and each having a variable feedback impedance controlled concurrently by said range selector.

2. A system as set forth in claim 1 wherein said digital signal handling means includes a microprocessor and a digital memory for storing a fixed program for operating said microprocessor and characterizing data corresponding to each of said analog input signals.

3. A system as set forth in claim 1 and further including a housing means for housing in a common environment sources of the plurality of analog input signals, said input multiplexer, said variable gain amplifier means, said free triangle wave generator, said comparator means, said means for converting, said input selector and said range selector.

4. A system as set forth in claim 1 wherein said digital signal handling means includes a microprocessor and a digital memory for storing a fixed program for controlling said microprocessor.

* * * * *